United States Patent
Gore

[11] 3,990,773
[45] Nov. 9, 1976

[54] BINARY-CODED FRAUNHOFER HOLOGRAM RECORDING TECHNIQUE

[75] Inventor: Douglas Alan Gore, Billerica, Mass.

[73] Assignee: RCA Corporation, New York, N.Y.

[22] Filed: Nov. 17, 1975

[21] Appl. No.: 632,811

[52] U.S. Cl. .................................................. 350/3.5
[51] Int. Cl.² ........................................... G03H 1/16
[58] Field of Search ..................................... 350/3.5

[56] References Cited
OTHER PUBLICATIONS
"Holographic Multicolor Moving Map Display", RCA Advanced Technology Lab, June 1972.

*Primary Examiner*—Ronald J. Stern
*Attorney, Agent, or Firm*—Edward J. Norton; George J. Seligsohn

[57] ABSTRACT

An array of equi-spaced photodetectors can be used to detect the reconstructed image of a binary-coded Fraunhofer hologram read out at a different wavelength from that employed in recording the hologram, without the chance of spurious data bits due to reinforcement of intermodulation components, by aperiodically spacing an array of points, corresponding to the bit positions of the binary code, during the recording of the hologram in an appropriate manner.

6 Claims, 7 Drawing Figures

WAVELENGTH (λ) COHERENT
LIGHT BIT-POINT IMAGE PROJECTOR

WAVELENGTH (λ) COHERENT
LIGHT BIT-POINT IMAGE PROJECTOR

BINARY-CODED FRAUNHOFER HOLOGRAM RECORDING TECHNIQUE

The Government has rights in this invention pursuant to Contract No. N62269-73-C-0609 awarded by the Department of the Navy.

This invention relates to a binary-coded Fraunhofer hologram and, more particularly, to apparatus for recording a Fraunhofer hologram of a binary code with coherent light of a first given wavelength, which hologram is intended to be read out with light of a second given wavelength.

In the operation of automatic optical information retrieval system, a binary-coded Fraunhofer hologram may be employed to provide an identity address for each one of a large plurality of selectable frames of information. For instance, a map display system for use by aircraft pilots has been developed in which each one of a large plurality of maps is stored as a focused image hologram impressed on a plastic medium. Each individual focused image hologram is identified by a corresponding impressed binary-coded Fraunhofer hologram. The Fraunhofer hologram is used in conjunction with an automatic retrievel system for selecting the particular focused image hologram to be displayed.

A straightforward approach for recording such a binary-coded Fraunhofer hologram would be to employ a periodic array of a predetermined number of equally spaced bit-position points situated in the front focal plane of a Fraunhofer transform lens. If the hologram recording process were perfectly linear, so that there were no intermodulation components generated, and if readout of the recorded hologram were accomplished with the same wavelength of light as that used during recording, this straightforward approach would be fine. However, in practice, blue wavelength coherent light is often employed for recording a binary-coded Fraunhofer hologram on a photoresist recording medium, because the photoresist is most sensitive to blue light. Similarly, red wavelength coherent light is commonly employed for recording on a silver halide recording medium due to practical considerations. However, near infra-red wavelength light is often employed for readout of this recorded hologram because solid-state injection lasers and photo-detectors which operate at this near infra-red wavelength are readily available in small, simple and inexpensive packages, which ar compatible with the logic circuitry of a retrieval system. Further, a binary-coded Fraunhofer hologram is generally recorded on a relatively non-linear recording medium employing recording parameters (fixed by other considerations) which result in the generation of a substantial amount of unwanted intermodulation components.

When a Fraunhofer hologram of a periodic array of object points, which is binary coded by the presence or absence of a point in each bit position is reconstructed, resulting intermodulation components between bits are reinforcing, and thereby may produce spurious data by inserting a binary ONE response in a bit position that should be a binary ZERO. Further, when a Fraunhofer hologram of a periodic array of objects points is read out with coherent light of a different wavelength from that employed in recording the Fraunhofer hologram, the reconstructed image of the object point does not form a periodic array. Instead, the spacing between each successive pair adjacent image pont is different. Such an image arrangement is incompatible with standard solid-state, linear arrays of equally spaced photodetectors.

The present invention is directed to a binary-coded Fraunhofer hologram recording technique which solves both of these problems by arranging an array of spaced points, corresponding to the bit positions of a binary code which are recorded as a Fraunhofer hologram, so that the spacing distances between each successive pair of adjacent spaced points of the array are aperiodic and can provide, on read out, substantially equal spacing distances between each successive pair of adjacent spaced points of the reconstructed image.

This and other features and advantages of the present invention will become more apparent from the following detailed description taken together with the accompanying drawing, in which.

Figure 3:
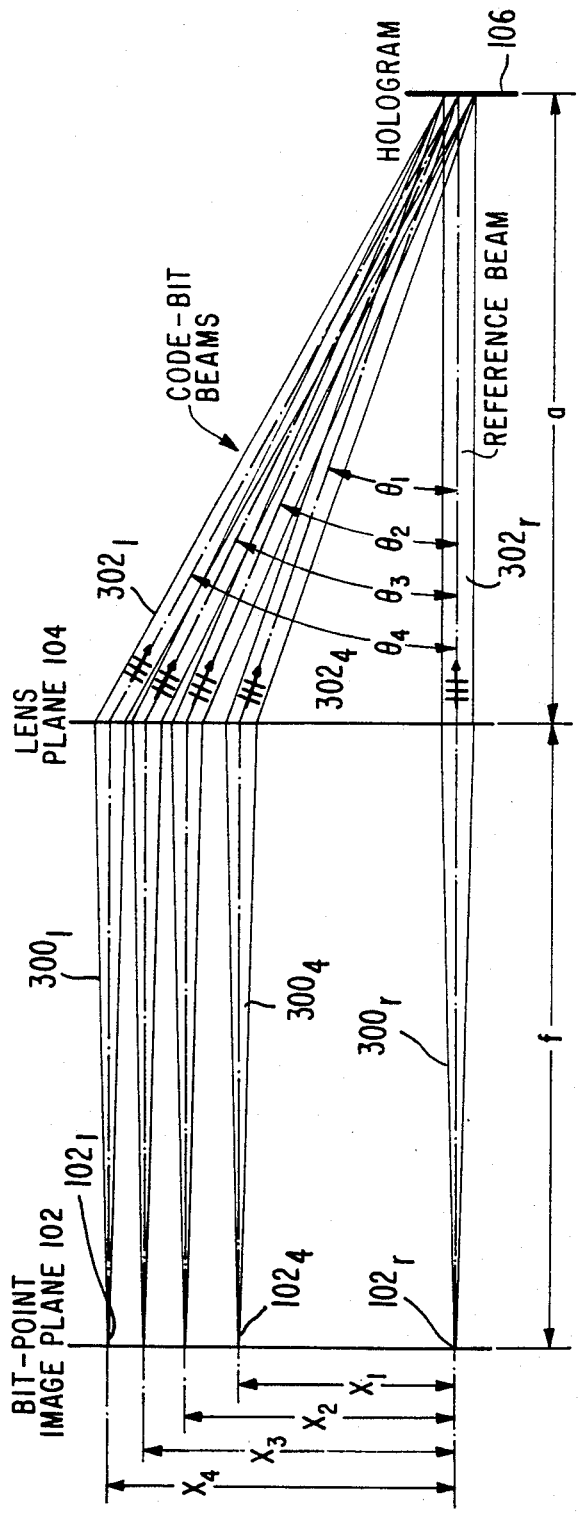
Figure 4A:
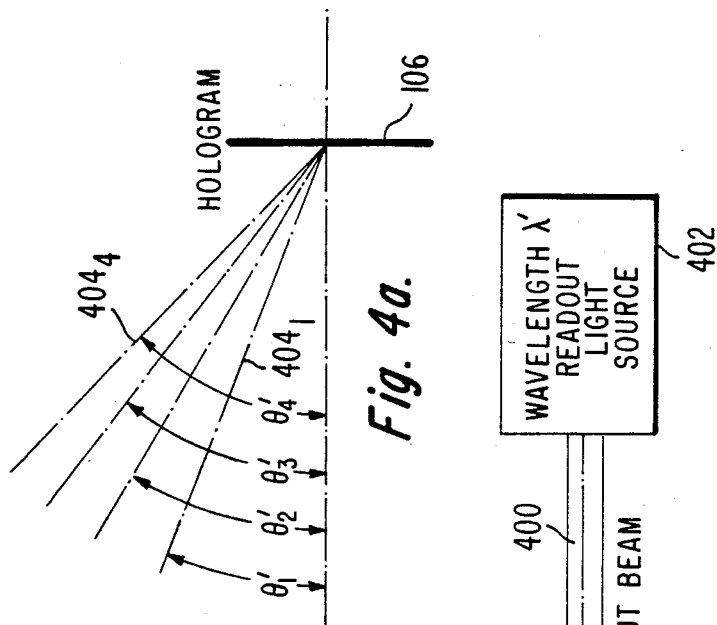
Figure 4:
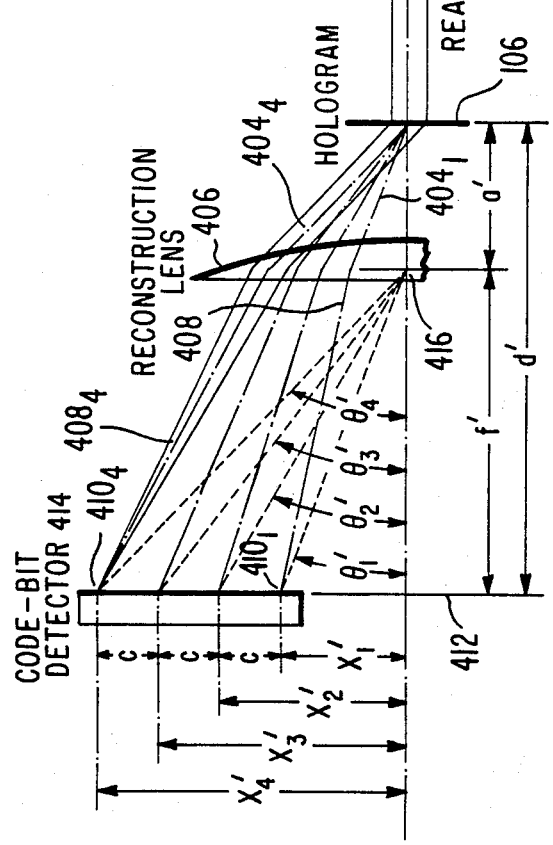

FIG. 3 indicates a typical binary-coded Fraunhofer hologram recording geometry,

FIGS. 4 and 4a indicate the readout geometry of a reconstructed image of spaced bit positions read out from a binary-coded Fraunhofer hologram which has been recorded, in accordance with the principles of the present invention, at a first wavelength and read out at a different second wavelength.

Figure 1:
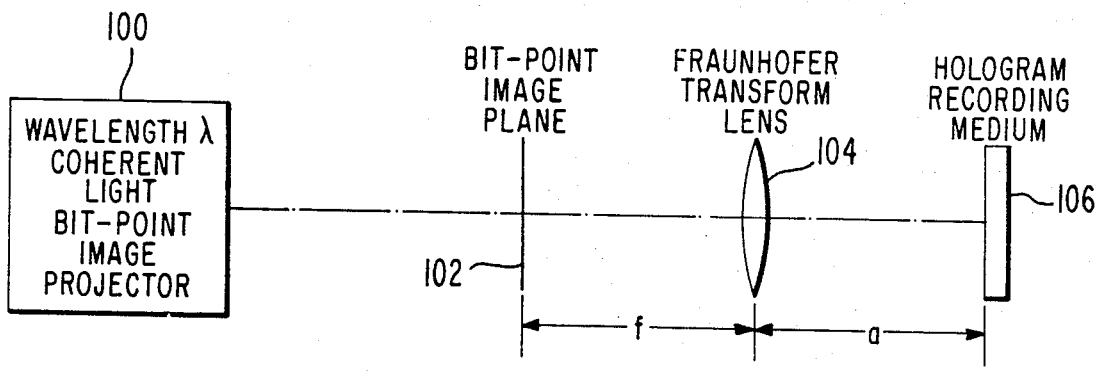
FIG. 1 is a generalized block diagram of apparatus for recording a Fraunhofer hologram.

Referring to FIG. 1, there is shown bit-point image projector 100, which projects coherent light of a given wavelength $\lambda$ composed of one or more individual object beams, each of which is focused at a separate point in bit-point image plane 102. Each object beam manifests a different binary-code bit position which has a given binary value, such as binary ONE. Image projector 100 may also focus a separate reference beam of wavelength $\lambda$ coherent light at a reference point in bit-point image plane 102, or, alternatively, projector 100 may provide a reference beam for recording a Fraunhofer hologram which is not focused in bit-point image plane 102.

As shown in FIG. 1, bit-point image plane 102 is substantially coincident with the front focal plane of Fraunhofer transform lens 104, which has a focal length $f$. Located on the back side of Fraunhofer transform lens 104, at a distance $a$ therefrom, is hologram recording means 106. The distance $a$ may be less than, equal to or greater than $f$.

Figure 2A:
FIG. 2 is a schematic diagram of a preferred embodiment of the bit-point image projector of FIG. 1, and FIG. 2a and FIG. 2b show alternative arrangements for the location of an arry of adjustable data-point shutters in the bit-point image projector of FIG. 2.
Figure 2B:
Figure 2:
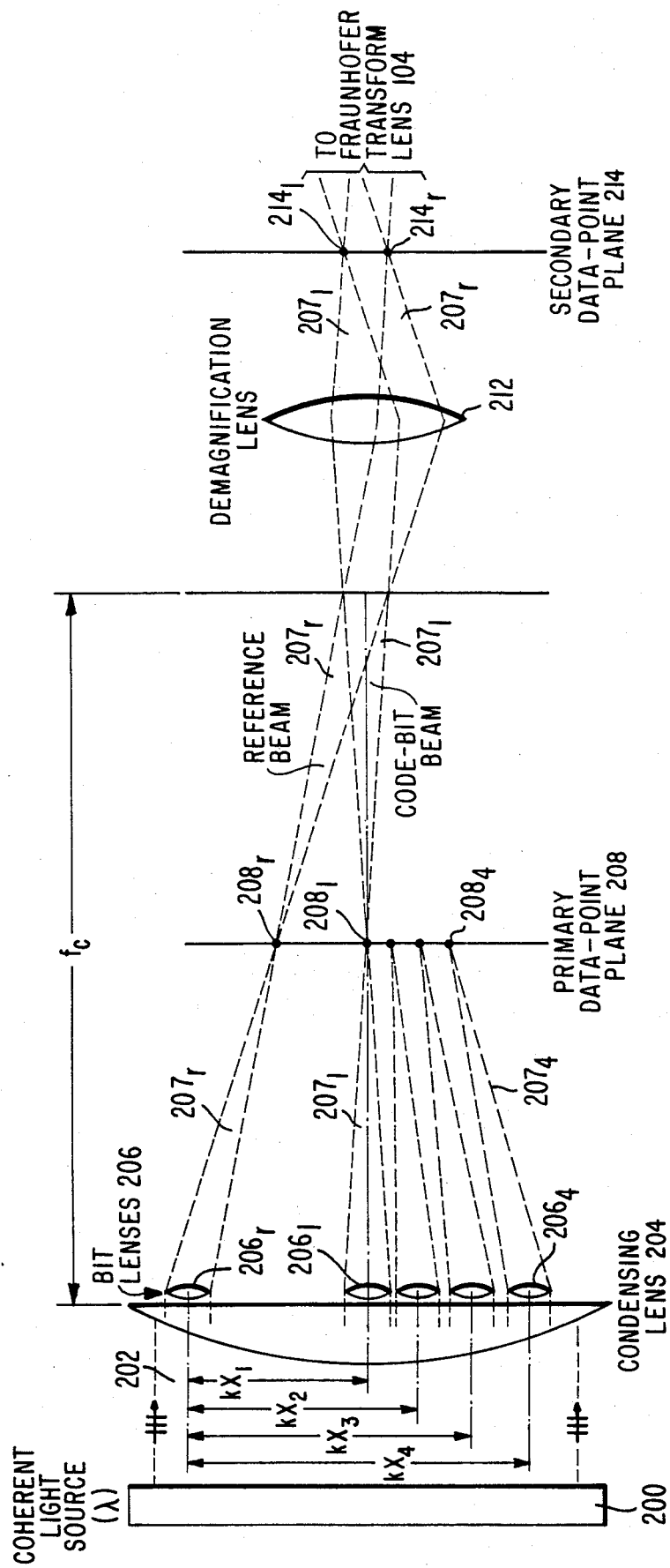

A preferred embodiment of bit-point image projector 100 of FIG. 1 is shown in FIG. 2. Specifically, as shown in FIG. 2, image projector 100 consists of coherent light source 200, which may comprise a laser, for deriving light beam 202 having a plane wavefront. Light beam 202 illuminates condensing lenses 204 having a focal length $f_c$. In close proximity to condensing lens 204 is a set of spaced bit lenses 206, each of which has a focal length typically equal to that of condensing lens 204. The set of bit lenses 206 includes reference bit lens $206_r$ and each of four spaced bit-position lenses $206_1 \ldots 206_4$. Specifically, as shown in FIG. 2, the four bit-position lenses $206_1 \ldots 206_4$ are located respectively at distances $kX_1 \ldots kX_4$ from reference bit lens $206_r$.

Light from beam 202 in passing through condensing lens 204 and reference bit lens $206_r$ forms a reference beam $107_4$, which focuses at a point $208_r$ in primary data-point plane 208. In a similar manner, light from beam 202 in passing through condensing lens 204 and any one of bit position lenses $206_1 \ldots 206_4$ form a corresponding individual one of object beams $207_1 \ldots 207_4$, which focus at points $208_1 \ldots 208_4$ in primary data-point plane 208.

As shown in FIG. 2a, an array of adjustable data-point shutters 210 may be located in primary data-point plane 208. Specifically, each bit-position points $208_1 \ldots 208_4$ has a separate adjustable shutter of array 210 in cooperative relationship therewith. Each bit portion manifesting a binary ONE has its adjustable shutter in an open position, while each bit position manifesting a binary ZERO has its adjustable shutter in a closed condition. For illustrative purposes, it is assumed in FIG. 2 that the respective binary values of bit position $208_1 \ldots 208_4$ are 1, 0, 0 and 0, so that only the adjustable shutter in cooperative relationship with point $208_1$ is in its open position, permitting only object beam $207_1$ to continue to the right of primary data-point plane 208 as a code-bit beam of coherent light.

In general, each of the code-bit beams, such as code-bit beam $207_1$, manifesting a binary ONE, together with reference beam $207_r$ of coherent light, are passed through demagnification lens 212, which refocuses these beams to respective points, such as points $214_r$ and $214_1$, in secondary data-point plane 214. In the preferred embodiment of image projector 100, specifically shown in FIG. 2, secondary data-point plane 214 constitutes bit-point image plane 102 of FIG. 1, which is substantially coincident with the front focal plane of Fraunhofer transform lens 104.

The use of demagnification lens 212 permits the spacing between points in secondary data-point plane 214, such as the spacing between point $214_r$ and $214_1$, to be substantially smaller than, although proportional to, the corresponding spacing between points in primary data-points in primary data-point plane 208, such as point $208_r$ and $208_1$, and between the corresponding bit lenses of set 206. The relatively small spacing between data points in secondary data-point plane 214 permits the use of a relatively smaller and less expensive Fraunhofer transform lens 104 than would otherwise be the case if demagnification lens 212 were not employed, which is an advantage. At the same time, the scale of the spacing istances between bit lenses 206, which is what determines the spacing distances between the data points in secondary data-point plane 214, may be made relatively large. The large scale spacing distances between bit lenses 206 permit the respective positions of the bit lenses to be set with a high degree of precision and accuracy.

Thus, although the use of demagnification lens 212 is highly desirable, it is not essential. In a first modification of image projector 100, demagnification lens 207 may be omitted, in which case primary data-point plane 208 itself would constitute bit-point image plane 102 of FIG. 1.

In a second modification of the image projector 100 shown in FIG. 2, an array of adjustable data-point shutters 216 could be situated in secondary data-point plane 214, as shown in FIG. 2b, instead of the array of adjustable data-point shutters 210 being situated in primary data-point plane 208, shown in FIG. 2a, as discussed above in connection with the preferred embodiment of image projector 100 shown in FIG. 2.

Referring now to FIG. 3, there is shown a typical example of the recording geometry of the binary-coded Fraunhofer hologram. For clarity in the drawing, each of the individual beams of coherent light of the recording wavelength $\lambda$ has been shown much narrower than actually exists in practice. However, the geometric relationships illustrated by FIG. 3 are not affected by this variation.

Point $102_r$ in bit-point image plane 102 (which corresponds to point $214_r$ in secondary data-point plane 214 of FIG. 2) gives rise to a diverging reference beam $300_r$. Similarly, each of bit-position points $201_1 \ldots 102_4$ in bit-point image plane 102, when manifesting a binary ONE, gives rise to an individual diverging code-bit object beams $300_1 \ldots 300_4$. Respective bit-position points in bit image plane 102 correspond with respective bit position points in secondary data-point plane 214 of FIG. 2. Therefore, the spacing distances $X_1 \ldots X_4$ between the points of bit image plane 102, shown in FIG. 3, are proportional to the spacing distances $kX_1 \ldots kX_4$ between the bit lenses 206 of FIG. 2.

As known in the art, Fraunhofer transform lens 104 transforms each of diverging light beams $300_1 \ldots 300_4$ and $300_r$ into corresponding plane-wave beams $302_1 \ldots 302_4$ and $302_r$ that are inclined with respect to the optic axis of the system by an angle which is a function of the transverse distance in bit image plane 102 of the originating bit point from the optic axis. For simplicity in the drawing, reference point $102_r$ has been shown as coincident with the focal point of lens 104, which is on the optic axis, although this is not essential to the present invention. In any case, plane-wave code-bit beams $302_1 \ldots 302_4$ are oriented at respective angles $\theta_1 \ldots \theta_4$ relative to plane-wave reference beam $302_r$ in accordance with the respective locations of points $102_1 \ldots 102_4$ and $102_r$ in bit-point image plane 102. A hologram is recorded on recording medium 106 in response to interference between the respective code-bit beams and the reference beam of coherent light incident thereon. All the characteristics of the recorded hologram with which the present invention is concerned are determined solely by (1) the wavelength of the coherent light, (2) the presence or absence of a code-bit beam in any bit-position, (3) the spacing distances $X_1 \ldots X_4$, (4) and, of course, the fixed recording parameters.

Referring now to FIGS. 4 and 4a, there is shown the readout geometry employed by an arrangement for reading out the recorded hologram with readout light of a different wavelength from that employed in recordiing the hologram. Specifically, hologram 106 is illuminated with readout beam 400 of light from readout light source 402 having a wavelength $\lambda'$, rather than the recording wavelength $\lambda$. The first order diffraction output pattern from hologram 106 includes an individual plane-wave reconstructed beam, such as beam $404_4$ corresponding to each recorded bit position manifesting a binary ONE. Although, in practice, each of reconstructed plane-wave beams $404_1 \ldots 404_4$ has substantial width, for the sake of clarity, in FIG. 4, plane wave reconstructed beam $404_4$ has been shown as having a relatively narrow width and the other ones of reconstructed beams $404_1 \ldots 404_4$ in FIG. 4 and in FIG. 4a have been represented only be their center lines. Further, the aperture of reconstruction lens 406, which is located at a distance $a'$ from hologram 106, has been greatly exaggerated in FIG. 4. These alterations in the drawing do not in any way affect the readout geometry which is illustrated by FIGS. 4 and 4a.

Reconstruction lens 406 transforms each plane-wave reconstruct beam, such as beam 404$_4$, into a corresponding converging reconstructed wave, such as converging beam 408$_4$. Each of converging reconstructed beams 408$_1$ . . . 408$_4$ converges to a separate point 410$_1$ . . . 410$_4$ in the back focal plane 412 of reconstruction lens 406. In cooperative relationship with focal plane 412 is code-bit detector 414, which includes an array of equi-spaced photodetectors in cooperative relationship with spaced points 410$_1$ . . . 410$_4$, for detecting the presence or absence of reconstructed beams 408$_1$ . . . 408$_4$.

As shown in FIG. 4a, the respective diffraction angle of plane-wave beams 404$_1$ . . . 404$_4$ are $\theta_1'$ . . . $\theta_4'$. In general, as shown in FIG. 4, rays of each of these reconstructed beams, in passing through reconstruction lens 406, are refracted thereby. However, any ray passing through center 416 of reconstruction lens 406 would not be refracted. However, all rays of any reconstruction beam, including a ray passing through center 416 of reconstruction lens 406, would still converge to the same reconstruction point, such as point 410$_1$ . . . 410$_4$, in focal plane 412. Therefore, as indicated by the dashed lines in FIG. 4, the respective angles between center point 416 of reconstruction lens 406 and each respective one of points 410$_1$ . . . 410$_4$ is also $\theta_1'$ . . . $\theta_4'$ (i.e., the dashed lines are parallel to corresponding ones of plane-wave beams 302$_1$ . . . 302$_4$).

As shown in FIG. 4, the desired relationship between the respective positions of reconstructed points 410$_1$ . . . 410$_4$ is $$(X_4' - X_3') = (X_3' - X_2') = (X_2' - X_1') = C \quad (1)$$

In order for the relationship shown in equation (1) to be realized, the respective values of spacing distances $X_1$ . . . $X_4$ in FIG. 3 (and hence the spacing distances $kX_1$ . . . $kX_4$ in FIG. 2) must be properly selected. Specifically, these values of $X_1$ . . . $X_4$ are a function of the recording wavelength, the readout wavelength, the recording geometry and the readout geometry as related by known diffraction-grating theory.

Specifically, in accordance with the readout geometry shown in FIG. 4

$$\theta_1' = \arctan \frac{X_1'}{f} \quad (2a)$$

$$\theta_2' = \arctan \frac{X_2'}{f} \quad (2b)$$

$$\theta_3' = \arctan \frac{X_3'}{f} \quad (2c)$$

$$\theta_4' = \arctan \frac{X_4'}{f} \quad (2d)$$

However, in accordance with diffraction-grating theory $$\theta_1 = \arcsin \frac{\lambda}{\lambda'} \sin \theta_1' \quad (3a)$$

$$\theta_2 = \arcsin \frac{\lambda}{\lambda'} \sin \theta_2' \quad (3b)$$

$$\theta_3 = \arcsin \frac{\lambda}{\lambda'} \sin \theta_3' \quad (3c)$$

$$\theta_4 = \arcsin \frac{\lambda}{\lambda'} \sin \theta_4' \quad (3d)$$

—continued

However, in accordance with the recording geometry shown in FIG. 3

$$X_1 = a \tan \theta_1 \quad (4a)$$

$$X_2 = a \tan \theta_2 \quad (4b)$$

$$X_3 = a \tan \theta_3 \quad (4c)$$

$$X_4 = a \tan \theta_4 \quad (4d)$$

It can be seen from the foregoing sets of equations (1) – (4d) that the respective values of $X_1$ . . . $X_4$ are uniquely determined by and may be computed from the value C (the distance between adjacent photodetectors) and some arbitrarily selected single reference distance, such as $X_1'$. Further, and most important, because of the trigonometric nature of the relationship provided by these equations, the respective spacing distances between adjacent recording bit positions is aperiodic. Therefore, no spurious detected data due to reinforcement of intermodulaton components can take place.

Although a particular recording and readout geometry has been utilized to illustrate the principles of this invention, these principles apply with equal force to any other specific recording and readout geometry.

What is claimed is:

1. In apparatus comprising means including a coherent light projector and a Fraunhofer transform lens for recording on a recording medium a Fraunhofer hologram of a binary code having at least three bit positions, wherein each respective bit position corresponds to a different point of an array of spaced points situated at preselected positions along a given line located in the front focal plane of said Fraunhofer transform lens, said Fraunhofer transform lens having a first given focal length and being situated between said array of spaced points and said recording medium at a first given distance from said recording medium, wherein only each respective bit position having a given binary value is manifested by an individual object beam of coherent light from said projector of a first given wavelength emanating from the spaced point corresponding to the bit position, each object beam and a reference beam of said coherent light from said projector of said first given wavelength simultaneously illuminating said recording medium to record said Fraunhofer hologram thereon, and wherein said recorded Fraunhofer hologram is intended to be read out with a readout beam of a second given wavelength different from said first given wavelength to reconstruct an image of spaced points corresponding to the respective bit positions of said binary code in the back focal plane of a reconstruction lens of a second given focal length, said reconstruction lens being disposed between said recorded Fraunhofer hologram and said image of spaced points at a second given distance from said recorded Fraunhofer hologram; the improvement therein wherein:

said preselected positions of said spaced points of said array have those certain different respective predetermined spacing distances between each successive pair of adjacent spaced points of said array which certain respective predetermined distances provide on read out substantially equal spacing distances between each successive pair of adjacent spaced points of said reconstructed image.

2. The apparatus defined in claim 1, wherein said projector comprises optical means including a linear set of spaced bit lenses and a corresponding set of shutters for deriving said array of spaced points in the front focal plane of said Fraunhofer transform lens in response to being illuminated by coherent light having a predetermined wavefront, and a source of coherent light of said first given wavelength for illuminating said optical means with coherent light having said predetermined wavefront.

3. The appratus defined in claim 2, wherein said linear set of spaced bit lenses includes a reference lens and an individual bit lens corresponding to each bit position in said binary code spaced a different given distance from said reference lens such that the respective spacing distances between each successive pair of adjacent bit lenses is proportional to said certain different respective predetermined spacing distances between each successive pair of adjacent spaced points of said array and wherein coherent light passing through said reference lens gives rise to said reference beam emanating from a reference point in the front focal plane of said Fraunhofer lens, said reference point being situated a distance from any particular one of said spaced points which is proportional to the given distance from said reference lens and the bit lens deriving that particular one of said spaced points.

4. The apparatus defined in claim 3 wherein said optical means focuses said coherent light passing through each bit lens of said set into a corresponding point in a data-point plane, and wherein said set of shutters is situated substantially in said data point plane in cooperative relationship with each point corresponding to a bit position of said binary code for determining the binary value of that bit position.

5. The apparatus defined in claim 4, wherein said data-point plane is substantially coincident with the front focal plane of said Fraunhofer transform lens.

6. The apparatus defined in claim 4, wherein said optical means includes a demagnification lens for imaging one or more respective points in a primary data-point plane to which said coherent light is initially focused into a secondary data-point plane which is substantially coincident with the front focal plane of said Fraunhofer transform lens, said set shutters being situated substantially in a certain one of said primary and secondary data-point planes.

* * * * *

UNITED STATES PATENT OFFICE
CERTIFICATE OF CORRECTION

PATENT NO. : 3,990,773

DATED : November 9, 1976

INVENTOR(S) : Douglas Alan Gore

It is certified that error appears in the above-identified patent and that said Letters Patent are hereby corrected as shown below:

Column 1, line 48, "ar" should read --are--

Column 1, line 62, "objects" should read --object--

Column 1, line 67, "pont" should read --point--

Column 2, line 22, "arry" should read --array--

Column 3, line 1, "107" should read -- $207_r$ --.

Column 3, line 13, "portion" should read --position--

Column 3, line 48, "istances" should read --distances--

Column 4, line 13, "$201_1$" should read --$102_1$--

Column 4, line 52, "recordiing" should read --recording--

Column 4, line 65, "be" should read --by--

Column 5, 2(a)-2(d), "$\frac{X_1'}{F}$" should read --$\frac{X_1'}{F'}$--

Column 5, 3(d), "$\theta_4 = \arcsin \frac{\lambda}{}\sin \theta_4'$" should read --$\theta_4 = \arcsin \frac{\lambda}{\lambda'}\sin \theta_4'$--

Column 6, line 24, "intermodulaton" should read --intermodulation--

UNITED STATES PATENT OFFICE
CERTIFICATE OF CORRECTION

PATENT NO. : 3,990,773

DATED : November 9, 1976

INVENTOR(S) : Douglas Alan Gore

It is certified that error appears in the above-identified patent and that said Letters Patent are hereby corrected as shown below:

Column 7, line 14, "appratus" should read ---apparatus---

Claims 7 and 8, ---omitted from the patent---

7. The apparatus defined in Claim 6, wherein said certain one of said data-point planes is said primary data point plane.

8. The apparatus defined in Claim 6, wherein said certain one of said data-point planes is said secondary data-point plane.

Signed and Sealed this

Fifteenth Day of March 1977

[SEAL]

Attest:

RUTH C. MASON
*Attesting Officer*

C. MARSHALL DANN
*Commissioner of Patents and Trademarks*